United States Patent
Rofougaran et al.

(10) Patent No.: US 11,659,409 B2
(45) Date of Patent: *May 23, 2023

(54) NON-LINE-OF-SIGHT (NLOS) COVERAGE FOR MILLIMETER WAVE COMMUNICATION

(71) Applicant: Movandi Corporation, Irvine, CA (US)

(72) Inventors: Ahmadreza Rofougaran, Newport Beach, CA (US); Sam Gharavi, Irvine, CA (US); Kartik Sridharan, San Diego, CA (US); Michael Boers, South Turramurra (AU); Seunghwan Yoon, Irvine, CA (US); Donghyup Shin, Irvine, CA (US); Farid Shirinfar, Granada Hills, CA (US); Stephen Wu, Fountain Valley, CA (US); Maryam Rofougaran, Rancho Palos Verdes, CA (US)

(73) Assignee: Movandi Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/243,747

(22) Filed: Apr. 29, 2021

(65) Prior Publication Data

US 2021/0250782 A1  Aug. 12, 2021

Related U.S. Application Data

(63) Continuation of application No. 16/866,536, filed on May 4, 2020, now Pat. No. 11,109,243, which is a
(Continued)

(51) Int. Cl.
*H04W 16/28* (2009.01)
*H04B 3/23* (2006.01)
(Continued)

(52) U.S. Cl.
CPC ............ *H04W 16/28* (2013.01); *H01Q 1/242* (2013.01); *H03F 3/602* (2013.01); *H04B 3/232* (2013.01);
(Continued)

(58) Field of Classification Search
CPC .... H04B 3/232; H04B 7/0408; H04B 7/0695; H04W 16/28; H04W 24/02; H01Q 1/242; H03F 3/602; H03G 3/3052
See application file for complete search history.

(56) References Cited

U.S. PATENT DOCUMENTS 5,724,337 A   3/1998  Kawano et al.
6,731,904 B1  5/2004  Judd
(Continued)

OTHER PUBLICATIONS

Corrected Notice of Allowance for U.S. Appl. No. 16/920,191 dated Feb. 15, 2022.
(Continued)

*Primary Examiner* — Dominic E Rego
(74) *Attorney, Agent, or Firm* — Chip Law Group

(57) ABSTRACT

A system, in an active reflector device, adjusts a first amplification gain of each of a plurality of radio frequency (RF) signals received at a receiver front-end from a first equipment via a first radio path of an NLOS radio path. A first phase shift is performed on each of the plurality of RF signals with the adjusted first amplification gain. A combination of the plurality of first phase-shifted RF signals is split at a transmitter front-end. A second phase shift on each of the split first plurality of first phase-shifted RF signals is performed. The plurality of RF signals as a directed beam is transmitted to a second equipment via a second radio path of the NLOS radio path.

20 Claims, 7 Drawing Sheets

Related U.S. Application Data continuation of application No. 16/294,025, filed on Mar. 6, 2019, now Pat. No. 10,721,634, which is a continuation of application No. 15/607,743, filed on May 30, 2017, now Pat. No. 10,321,332.

(51) Int. Cl.
  *H04B 7/0408* (2017.01)
  *H04B 7/06* (2006.01)
  *H04W 24/02* (2009.01)
  *H01Q 1/24* (2006.01)
  *H03F 3/60* (2006.01)
  *H03G 3/30* (2006.01)

(52) U.S. Cl.
  CPC ......... *H04B 7/0408* (2013.01); *H04B 7/0695* (2013.01); *H04W 24/02* (2013.01); *H03G 3/3052* (2013.01)

(56) References Cited

U.S. PATENT DOCUMENTS

| | | |
|---|---|---|
| 7,079,079 B2 | 7/2006 | Jo et al. |
| 7,675,465 B2 | 3/2010 | Doan et al. |
| 7,679,576 B2 | 3/2010 | Riedel et al. |
| 7,715,466 B1 | 5/2010 | Oh et al. |
| 9,130,262 B2 | 9/2015 | Park et al. |
| 9,178,546 B1 | 11/2015 | Klemes |
| 10,080,274 B2 | 9/2018 | Johnson |
| 10,103,853 B2 | 10/2018 | Moshfeghi |
| 10,199,717 B2 | 2/2019 | Rofougaran et al. |
| 10,320,090 B2 | 6/2019 | Zou et al. |
| 10,355,720 B2 | 7/2019 | Shattil |
| 10,389,041 B2 | 8/2019 | Yoon et al. |
| 10,560,179 B2 | 2/2020 | Gharavi et al. |
| 10,854,995 B2 | 12/2020 | Rofougaran et al. |
| 10,965,411 B2 | 3/2021 | Moshfeghi |
| 11,018,816 B2 | 5/2021 | Moshfeghi |
| 11,056,764 B2 | 7/2021 | Rofougaran et al. |
| 11,075,724 B2 | 7/2021 | Moshfeghi |
| 11,088,756 B2 | 8/2021 | Gharavi et al. |
| 11,128,415 B2 | 9/2021 | Moshfeghi |
| 11,342,968 B2 | 5/2022 | Yoon et al. |
| 11,394,128 B2 | 7/2022 | Rofougaran et al. |
| 2004/0204114 A1 | 10/2004 | Brennan et al. |
| 2005/0088260 A1 | 4/2005 | Ajioka et al. |
| 2005/0136943 A1 | 6/2005 | Banerjee et al. |
| 2006/0040615 A1 | 2/2006 | Mohamadi |
| 2006/0063487 A1 | 3/2006 | Cleveland et al. |
| 2006/0170595 A1 | 8/2006 | Gustaf |
| 2008/0207259 A1 | 8/2008 | Rofougaran |
| 2009/0046624 A1 | 2/2009 | Martinez et al. |
| 2009/0066590 A1 | 3/2009 | Yamada et al. |
| 2009/0156227 A1 | 6/2009 | Frerking et al. |
| 2009/0175214 A1 | 7/2009 | Sfar et al. |
| 2010/0159859 A1 | 6/2010 | Rofougaran |
| 2010/0167639 A1 | 7/2010 | Ranson et al. |
| 2010/0284446 A1 | 11/2010 | Mu et al. |
| 2011/0109507 A1 | 5/2011 | Warnick |
| 2011/0159801 A1 | 6/2011 | Maltsev et al. |
| 2011/0190005 A1 | 8/2011 | Cheon et al. |
| 2011/0294415 A1 | 12/2011 | Jeon et al. |
| 2012/0003925 A1 | 1/2012 | Coldrey et al. |
| 2012/0149300 A1 | 6/2012 | Forster |
| 2013/0003645 A1 | 1/2013 | Shapira et al. |
| 2013/0034128 A1 | 2/2013 | Gore et al. |
| 2013/0039342 A1 | 2/2013 | Kazmi |
| 2013/0122802 A1 | 5/2013 | Wang et al. |
| 2013/0149300 A1 | 6/2013 | Hiatt et al. |
| 2014/0104124 A1 | 4/2014 | Chernokalov et al. |
| 2015/0296344 A1 | 10/2015 | Trojer et al. |
| 2015/0340765 A1 | 11/2015 | Dang et al. |
| 2016/0049723 A1 | 2/2016 | Baks et al. |
| 2016/0056946 A1 | 2/2016 | Moher |
| 2016/0204513 A1 | 7/2016 | Yemelong et al. |
| 2016/0359230 A1 | 12/2016 | Wang et al. |
| 2017/0324171 A1 | 11/2017 | Shehan |
| 2017/0353338 A1 | 12/2017 | Amadjikpe et al. |
| 2018/0063139 A1 | 3/2018 | Day et al. |
| 2018/0191062 A1 | 7/2018 | Ndip et al. |
| 2018/0231651 A1 | 8/2018 | Charvat |
| 2018/0269576 A1 | 9/2018 | Scarborough et al. |
| 2018/0316090 A1 | 11/2018 | Foo |
| 2019/0020399 A1 | 1/2019 | Coutts |
| 2019/0020402 A1 | 1/2019 | Gharavi et al. |
| 2019/0020407 A1 | 1/2019 | Gharavi et al. |
| 2019/0089069 A1 | 3/2019 | Niroo et al. |
| 2019/0139914 A1 | 5/2019 | Kirino et al. |
| 2019/0230626 A1 | 7/2019 | Rune et al. |
| 2019/0297648 A1 | 9/2019 | Nagaraja et al. |
| 2019/0334253 A1 | 10/2019 | Corman et al. |
| 2020/0036414 A1 | 1/2020 | Shattil |
| 2020/0185299 A1 | 6/2020 | Chang et al. |
| 2020/0322016 A1 | 10/2020 | Kim et al. |
| 2021/0058140 A1 | 2/2021 | Schwab et al. |
| 2021/0109145 A1 | 4/2021 | Haustein et al. |
| 2021/0203085 A1 | 7/2021 | Jordan et al. |

OTHER PUBLICATIONS

Corrected Notice of Allowance for U.S. Appl. No. 17/091,520 dated Apr. 26, 2022.
Corrected Notice of Allowance for U.S. Appl. No. 17/091,520 dated Feb. 2, 2022.
Corrected Notice of Allowance for U.S. Appl. No. 17/091,520 dated Mar. 17, 2022.
Final Office Action for U.S. Appl. No. 17/011,042 dated Mar. 14, 2022.
Non-Final Office Action for U.S. Appl. No. 17/004,373 dated Feb. 15, 2022.
Non-Final Office Action for U.S. Appl. No. 17/060,182 dated Feb. 25, 2022.
Non-Final Office Action for U.S. Appl. No. 17/208,984 dated Apr. 12, 2022.
Non-Final Office Action for U.S. Appl. No. 17/230,566 dated Apr. 12, 2022.
Notice of Allowance for U.S. Appl. No. 16/920,191 dated Feb. 2, 2022.
Notice of Allowance for U.S. Appl. No. 17/171,521 dated Apr. 6, 2022.
Corrected Notice of Allowance for U.S. Appl. No. 16/398,156 dated Nov. 17, 2021.
Corrected Notice of Allowance for U.S. Appl. No. 17/091,520 dated Dec. 14, 2021.
Corrected Notice of Allowance for U.S. Appl. No. 17/091,520 dated Jan. 28, 2022.
Non-Final Office Action for U.S. Appl. No. 16/927,225 dated Dec. 22, 2021.
Non-Final Office Action for U.S. Appl. No. 16/935,422 dated Jan. 21, 2022.
Non-Final Office Action for U.S. Appl. No. 16/935,515 dated Jan. 21, 2022.
Non-Final Office Action for U.S. Appl. No. 17/011,042 dated Oct. 29, 2021.
Non-Final Office Action for U.S. Appl. No. 17/337,529 dated Jan. 26, 2022.
Corrected Notice of Allowance for U.S. Appl. No. 16/233,044 dated Sep. 10, 2021.
Corrected Notice of Allowance for U.S. Appl. No. 16/377,847 dated Aug. 20, 2021.
Corrected Notice of Allowance for U.S. Appl. No. 16/388,043 dated Aug. 27, 2021.
Corrected Notice of Allowance for U.S. Appl. No. 16/391,628 dated Jul. 30, 2021.
Corrected Notice of Allowance for U.S. Appl. No. 16/398,156 dated Aug. 13, 2021.
Non-Final Office Action for U.S. Appl. No. 16/920,191 dated Oct. 15, 2021.

(56) References Cited

OTHER PUBLICATIONS

Notice of Allowance for U.S. Appl. No. 17/091,520 dated Oct. 27, 2021.
Supplemental Notice of Allowance for U.S. Appl. No. 16/451,980 dated Aug. 6, 2021.
Supplemental Notice of Allowance for U.S. Appl. No. 16/941,690 dated Aug. 9, 2021.
Corrected Notice of Allowance for U.S. Appl. No. 16/125,757 dated Jul. 16, 2021.
Corrected Notice of Allowance for U.S. Appl. No. 16/125,757 dated Jun. 28, 2021.
Corrected Notice of Allowance for U.S. Appl. No. 16/204,397 dated Apr. 28, 2021.
Corrected Notice of Allowance for U.S. Appl. No. 16/204,397 dated Jun. 7, 2021.
Corrected Notice of Allowance for U.S. Appl. No. 16/233,044 dated Jun. 11, 2021.
Corrected Notice of Allowance for U.S. Appl. No. 16/354,390 dated Jul. 13, 2021.
Corrected Notice of Allowance for U.S. Appl. No. 16/354,390 dated Jun. 3, 2021.
Corrected Notice of Allowance for U.S. Appl. No. 16/364,956 dated Jun. 23, 2021.
Corrected Notice of Allowance for U.S. Appl. No. 16/364,956 dated May 6, 2021.
Corrected Notice of Allowance for U.S. Appl. No. 16/377,847 dated Jul. 13, 2021.
Corrected Notice of Allowance for U.S. Appl. No. 16/377,847 dated Jul. 6, 2021.
Corrected Notice of Allowance for U.S. Appl. No. 16/391,628 dated Jun. 29, 2021.
Corrected Notice of Allowance for U.S. Appl. No. 16/689,758 dated Apr. 29, 2021.
Corrected Notice of Allowance for U.S. Appl. No. 16/689,758 dated Jul. 6, 2021.
Corrected Notice of Allowance for U.S. Appl. No. 16/689,758 dated May 27, 2021.
Corrected Notice of Allowance for U.S. Appl. No. 16/866,536 dated Apr. 29, 2021.
Final Office Action for U.S. Appl. No. 17/011,042 dated Jul. 2, 2021.
Non-Final Office Action for U.S. Appl. No. 17/091,520 dated Jul. 8, 2021.
Notice of Allowability for U.S. Appl. No. 16/819,388 dated Apr. 28, 2021.
Notice of Allowability for U.S. Appl. No. 16/819,388 dated May 27, 2021.
Notice of Allowance for U.S. Appl. No. 16/233,044 dated Jun. 4, 2021.
Notice of Allowance for U.S. Appl. No. 16/388,043 dated May 7, 2021.
Notice of Allowance for U.S. Appl. No. 16/398,156 dated Jul. 6, 2021.
Notice of Allowance for U.S. Appl. No. 16/941,690 dated May 5, 2021.
Supplemental Notice of Allowance for U.S. Appl. No. 16/451,980 dated Jun. 30, 2021.
Supplemental Notice of Allowance for U.S. Appl. No. 16/451,980 dated May 18, 2021.
Supplemental Notice of Allowance for U.S. Appl. No. 16/451,998 dated Jun. 24, 2021.
Supplemental Notice of Allowance for U.S. Appl. No. 16/451,998 dated May 18, 2021.
Supplemental Notice of Allowance for U.S. Appl. No. 16/452,023 dated Apr. 30, 2021.
Supplemental Notice of Allowance for U.S. Appl. No. 16/666,680 dated Jul. 9, 2021.
Supplemental Notice of Allowance for U.S. Appl. No. 16/666,680 dated Jun. 10, 2021.
Supplemental Notice of Allowance for U.S. Appl. No. 16/866,536 dated Jul. 21, 2021.
Supplemental Notice of Allowance for U.S. Appl. No. 16/866,536 dated Jun. 7, 2021.
Supplemental Notice of Allowance for U.S. Appl. No. 16/941,690 dated May 18, 2021.
Corrected Notice of Allowance for U.S. Appl. No. 16/920,191 dated Jun. 22, 2022.
Corrected Notice of Allowance for U.S. Appl. No. 16/920,191 dated May 10, 2022.
Corrected Notice of Allowance for U.S. Appl. No. 16/920,191 dated May 18, 2022.
Corrected Notice of Allowance for U.S. Appl. No. 16/935,422 dated Jun. 8, 2022.
Corrected Notice of Allowance for U.S. Appl. No. 16/935,515 dated Jun. 8, 2022.
Corrected Notice of Allowance for U.S. Appl. No. 17/171,521 dated Jul. 7, 2022.
Corrected Notice of Allowance for U.S. Appl. No. 17/171,521 dated Jul. 13, 2022.
Corrected Notice of Allowance for U.S. Appl. No. 17/337,529 dated Aug. 3, 2022.
Final Office Action for U.S. Appl. No. 16/927,225 dated Jun. 24, 2022.
Non-Final Office Action for U.S. Appl. No. 17/011,042 dated Jul. 1, 2022.
Notice of Allowance for U.S. Appl. No. 16/935,515 dated Jun. 1, 2022.
Notice of Allowance for U.S. Appl. No. 17/004,373 dated May 23, 2022.
Notice of Allowance for U.S. Appl. No. 17/329,276 dated Jun. 28, 2022.
Notice of Allowance for U.S. Appl. No. 16/935,422 dated May 31, 2022.
Notice of Allowance for U.S. Appl. No. 17/060,182 dated Jun. 8, 2022.
Notice of Allowance for U.S. Appl. No. 17/337,529 dated May 4, 2022.
Corrected Notice of Allowance for U.S. Appl. No. 16/935,422 dated Oct. 17, 2022.
Corrected Notice of Allowance for U.S. Appl. No. 16/935,422 dated Sep. 14, 2022.
Corrected Notice of Allowance for U.S. Appl. No. 16/935,515 dated Oct. 17, 2022.
Corrected Notice of Allowance for U.S. Appl. No. 16/935,515 dated Sep. 14, 2022.
Corrected Noticeof Allowance for U.S. Appl. No. 17/171,521 dated Aug. 29, 2022.
Corrected Notice of Allowance for U.S. Appl. No. 17/329,276 dated Oct. 11, 2022.
Corrected Notice of Allowance for U.S. Appl. No. 17/337,529 dated Nov. 10, 2022.
Corrected Notice of Allowance for U.S. Appl. No. 17/337,529 dated Oct. 5, 2022.
Final Office Action for U.S. Appl. No. 17/011,042 dated Oct. 7, 2022.
Non-Final Office Action for U.S. Appl. No. 17/209,030 dated Oct. 14, 2022.
Non-Final Office Action for U.S. Appl. No. 17/230,696 dated Oct. 6, 2022.
Non-Final Office Action for U.S. Appl. No. 17/377,983 dated Oct. 26, 2022.
Non-Final Office Action for U.S. Appl. No. 17/382,398 dated Oct. 19, 2022.
Non-Final Office Action for U.S. Appl. No. 17/408,583 dated Nov. 4, 2022.
Non-Final Office Action for U.S. Appl. No. 17/408,606 dated Aug. 16, 2022.
Non-Final Office Action for U.S. Appl. No. 17/536,235 dated Oct. 11, 2022.
Non-Final Office Action for U.S. Appl. No. 17/742,648 dated Oct. 5, 2022.

(56) References Cited

OTHER PUBLICATIONS

Notice of Allowability for U.S. Appl. No. 17/337,529 dated Aug. 10, 2022.
Notice of Allowability for U.S. Appl. No. 17/004,373 dated Aug. 17, 2022.
Notice of Allowability for U.S. Appl. No. 17/004,373 dated Aug. 31, 2022.
Notice of Allowability for U.S. Appl. No. 17/004,373 dated Oct. 24, 2022.
Notice of Allowability for U.S. Appl. No. 17/060,182 dated Aug. 19, 2022.
Notice of Allowability for U.S. Appl. No. 17/060,182 dated Oct. 20, 2022.
Notice of Allowability for U.S. Appl. No. 17/060,182 dated Sep. 20, 2022.
Notice of Allowance for U.S. Appl. No. 16/927,225 dated Oct. 3, 2022.
Notice of Allowance for U.S. Appl. No. 17/208,984 dated Aug. 16, 2022.
Notice of Allowance for U.S. Appl. No. 17/230,566 dated Aug. 25, 2022.
Notice of Allowance for U.S. Appl. No. 17/365,037 dated Aug. 10, 2022.
Supplemental Notice of Allowability for U.S. Appl. No. 17/208,984 dated Nov. 10, 2022.
Corrected Notice of Allowance for U.S. Appl. No. 16/927,225 dated Nov. 23, 2022.
Corrected Notice of Allowance for U.S. Appl. No. 17/329,276 dated Nov. 23, 2022.
Corrected Notice of Allowance for U.S. Appl. No. 17/365,037 dated Nov. 15, 2022.
Corrected Notice of Allowance for U.S. Appl. No. 17/365,037 dated Nov. 25, 2022.
Corrected Notice of Allowance for U.S. Appl. No. 17/208,984 dated Nov. 23, 2022.
Non-Final Office Action for U.S. Appl. No. 17/887,672 dated Dec. 6, 2022.
Notice of Allowance for U.S. Appl. No. 17/863,874 dated Nov. 18, 2022.
Corrected Notice of Allowance for U.S. Appl. No. 16/927,225 dated Feb. 1, 2023.
Corrected Notice of Allowance for U.S. Appl. No. 17/209,030 dated Feb. 15, 2023.
Corrected Notice of Allowance for U.S. Appl. No. 17/365,037 dated Jan. 5, 2023.
Corrected Notice of Allowance for U.S. Appl. No. 17/742,648 dated Feb. 1, 2023.
Corrected Notice of Allowance for U.S. Appl. No. 17/863,874 dated Feb. 13, 2023.
Corrected Notice of Allowance for U.S. Appl. No. 17/863,874 dated Feb. 24, 2023.
Supplemental Notice of Allowance for U.S. Appl. No. 17/230,566 dated Jan. 5, 2023.
Final Office Action for U.S. Appl. No. 17/377,983 dated Feb. 10, 2023.
Non-Final Office Action for U.S. Appl. No. 17/011,042 dated Feb. 3, 2023.
Non-Final Office Action for U.S. Appl. No. 17/396,063 dated Jan. 18, 2023.
Non-Final Office Action for U.S. Appl. No. 17/903,092 dated Feb. 16, 2023.
Non-Final Office Action for U.S. Appl. No. 17/903,130 dated Feb. 27, 2023.
Notice of Allowability for U.S. Appl. No. 17/230,566 dated Feb. 2, 2023.
Notice of Allowance for U.S. Appl. No. 17/209,030 dated Feb. 8, 2023.
Notice of Allowance for U.S. Appl. No. 17/230,696 dated Jan. 20, 2023.
Notice of Allowance for U.S. Appl. No. 17/408,583 dated Feb. 27, 2023.
Notice of Allowance for U.S Appl. No. 17/408,606 dated Feb. 1, 2023.
Notice of Allowance for U.S. Appl. No. 17/536,235 dated Feb. 15, 2023.
Notice of Allowance for U.S. Appl. No. 17/742,648 dated Jan. 25, 2023.
Notice of Allowance for U.S. Appl. No. 17/946,734 dated Jan. 30, 2023.
Supplemental Notice of Allowance for U.S. Appl. No. 17/208,984 dated Jan. 5, 2023.
Final Office Action for U.S. Appl. No. 17/887,672 dated Mar. 30, 2023.
Non-Final Office Action for U.S. Appl. No. 17/898,706 dated Mar. 28, 2023.

NON-LINE-OF-SIGHT (NLOS) COVERAGE FOR MILLIMETER WAVE COMMUNICATION

CROSS-REFERENCE TO RELATED APPLICATIONS/INCORPORATION BY REFERENCE

This Patent Application makes reference to, claims priority to, claims the benefit of, and is a Continuation Application of U.S. patent application Ser. No. 16/866,536, filed May 4, 2020, which is a continuation of U.S. patent application Ser. No. 16/294,025, filed Mar. 6, 2019, which is a Continuation Application of U.S. patent application Ser. No. 15/607,743, filed May 30, 2017.

This Application also makes reference to:
Application Ser. No. 15/432,091, which was filed on Feb. 14, 2017, entitled "Outphasing Transmitters with Improved Wireless Transmission Performance and Manufacturability."

The above referenced Application is hereby incorporated herein by reference in its entirety.

FIELD OF TECHNOLOGY

Certain embodiments of the disclosure relate to reflector devices in a millimeter wave communication system. More specifically, certain embodiments of the disclosure relate to a method and system for providing NLOS coverage for millimeter wave communication.

BACKGROUND

Telecommunications hardware, such as a customer premise equipment (CPE), communicates with a base station over a wireless communication network, such as radio frequency (RF) communication network. In most of the scenarios, RF signals propagate from the base station to the CPE, for example, through NLOS radio paths. In the NLOS radio paths, the plurality of RF signals undergo multiple reflections during propagation from a transmitter device, such as the base station, to a receiver device, such as the CPE, due to various physical obstructing objects in RF signal path. Therefore, various reflector devices, such as active and passive reflectors, may be needed to provide such reflections for the RF communication along such NLOS radio paths. However, for the advanced fifth generation communication networks, such as the millimeter wave communication system, there are required dynamically programmed reflector devices that can provide an optimal NLOS coverage for a robust RF communication.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY OF THE DISCLOSURE

Systems and/or methods are provided for NLOS coverage for millimeter wave communication, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE DISCLOSURE

Certain embodiments of the disclosure may be found in a method and system for NLOS coverage for millimeter wave communication. In the following description, reference is made to the accompanying drawings, which form a part hereof, and in which is shown, by way of illustration, various embodiments of the present disclosure.

Figure 1:
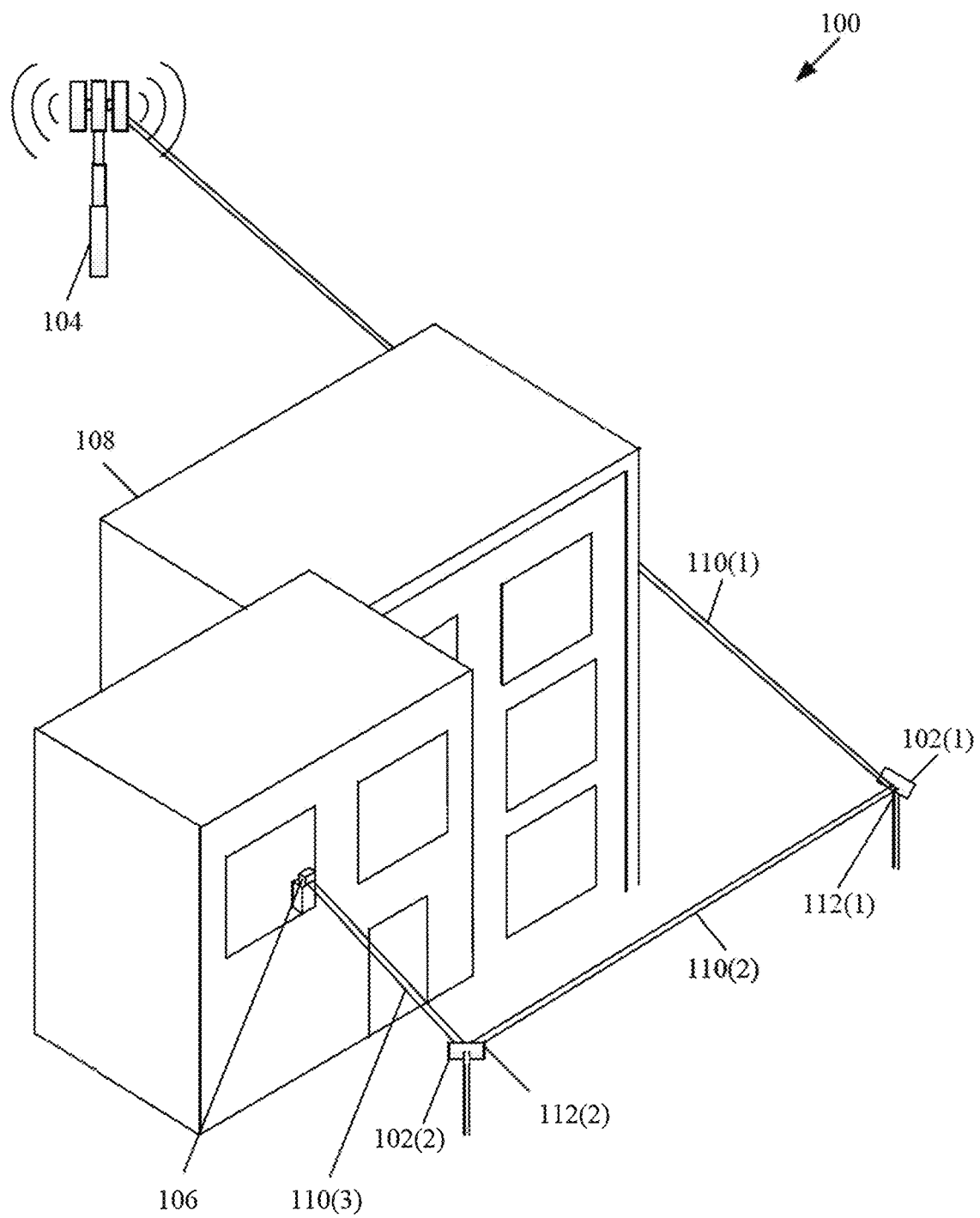
FIG. 1 is an exemplary network environment diagram, in accordance with an exemplary embodiment of the disclosure.

FIG. 1 is an exemplary network environment diagram, in accordance with an exemplary embodiment of the disclosure. With reference to FIG. 1, there is shown a plurality of reflector devices 102 that include at least one passive reflector device 102(1) and at least one active reflector device 102(2). There is further shown a base station 104 as an RF transmitter device, a customer premises equipment 106 as an RF receiver device, and customer premises 108. There is further shown an NLOS radio path 110 (that includes a first radio signal path 110(1), a second radio signal path 110(2), a third radio signal path 110(3)) and two bounce points 112(1) and 112(2). It may be understood that there is shown only one passive reflector device 102(1) and one active reflector device 102(2) for providing the two bounce points 112(1) and 112(2), respectively. However, the count of the passive reflector devices and the active reflector devices may increase based on the location of the base station 104, relative distance of the base station 104 from the CPE 106, and count and type of physical obstructing devices, without deviation from the scope of the disclosure.

The passive reflector device 102(1) may be configured to provide only a deflection to the plurality of RF signals without adjusting the amplitude gain and the phase shift of the plurality of RF signals. The passive reflector device 102(1) provides the deflection based on various parameters, such as an incident angle, scan angle, and size of the passive reflector device 102(1). The passive reflector device 102(1) may be positioned in a vicinity of a first physical obstructing object, such as a building, that may completely block the path of the plurality of RF signals. The passive reflector device 102(1) may be realized by a simple metal plane with a flat or a curved surface. The passive reflector device 102(1) may be arranged at an incident angle, so that the angle of incoming plurality of RF signals corresponds to the angle of the outcoming plurality of RF signals. An exemplary instance of the passive reflector device 102(1) is described in detail in FIG. 2.

The active reflector device 102(2) may be configured to perform a plurality of operations on the received plurality of RF signals. Examples of such operations may include, but are not limited to, adjusting an amplitude gain, adjusting phase shift, performing beam forming to generate a directed beam, and performing beam steering based on the phase shifting of the plurality of RF signals to deflect the directed beam at a desired angle. The active reflector device 102(2) may comprise two pluralities of circuits and for two-way communication between the CPE 106 and the base station 104. A first plurality of circuits includes a first receiver front-end and a first transmitter front-end and a second plurality of circuits includes a second receiver front-end and a second transmitter front-end. Antenna elements in the receiver arrays (of the first receiver front-end and second receiver front-end) and the transmitter arrays (of the first transmitter front-end and second transmitter front-end), may be dual-polarized, such as vertically polarized and horizontally polarized. Such dual-polarized antenna elements may be, for example, a patch antenna, a dipole antenna, or a slot antenna. It may be noted that the dual polarization of antenna elements is limited to precisely and mathematically vertical or horizontal. Notwithstanding, without deviation from the scope of the disclosure, dual polarization may refer to any two polarizations of an antenna, for example, substantially or approximately ±45 degrees. In other implementations or embodiments, the antenna polarizations may be non-orthogonal.

The active reflector device 102(2) may be positioned in a vicinity of a second physical obstructing object, such as a tinted glass, that may partially block the path of the plurality of RF signals. The active reflector device 102(2) may be realized by various components, such as two transmitter front-ends, two receiver front-ends, a plurality of low-noise amplifiers, a plurality of phase shifters, a combiner, a splitter, a plurality of power amplifiers, and mixers. The active reflector device 102(2) may require a substantial DC power for performing the above-mentioned operations. Various exemplary instances of the active reflector device 102(2) are described in detail in FIGS. 3A to 3C.

The base station 104 is a fixed point of communication that may communicate information, in form of the plurality of RF signals, to and from a transmitting/receiving device, such as the CPE 106. Multiple base stations, corresponding to one or more service providers, may be geographically positioned to cover specific geographical areas. Typically, bandwidth requirements serve as a guideline for a location of the base station 104 based on relative distance between the CPE 106 and the base station 104. The count of base stations depends, for example, on expected usage, which may be a function of population density, and geographic irregularities, such as buildings and mountain ranges, which may interfere with the plurality of RF signals.

The CPE 106 may correspond to a telecommunication hardware located inside the customer premises 108, such as an office facility or a home space. Examples of the CPE 106 may include, but are not limited to, a home router, a cable or satellite television set-top box, a VoIP base station, or other customized hardware.

The NLOS radio path 110 may correspond to a path of propagation of an RF signal that is obscured (partially or completely) by physical objects that make it difficult for the RF signal to pass through in a wireless communication network. Common physical objects between an RF transmitter device and an RF receiver device may include, for example, tall buildings, tinted glass, doors, walls, trees, physical landscape, and high-voltage power conductors. The NLOS radio path may be facilitated by various wireless communication standards, such as, but not limited to, IEEE 802.11n (Wi-Fi), IEEE 802.11ac (Wi-Fi), HSPA+(3G), WiMAX (4G), and Long Term Evolution (4G), 5G, power-line communication for 3-wire installations as part of ITU G.hn standard, and HomePlug AV2 specification. In accordance with an embodiment, the wireless communication network may facilitate extremely high frequency (EHF), which is the band of radio frequencies in the electromagnetic spectrum from 30 to 300 gigahertz. Such radio frequencies have wavelengths from ten to one millimeter, referred to as millimeter wave (mmW).

In operation, the RF transmitter device, for example the base station 104, may be configured to transmit the plurality of RF signals to the RF receiver device, for example the CPE 106. For such RF transmission to the CPE 106, the base station 104 may be configured to dynamically select reflector devices from the plurality of reflector devices 102. The plurality of reflector devices 102 may be positioned in a vicinity of a plurality of physical obstructing objects so as to provide an RF communication along the NLOS radio path.

The base station 104 may be configured to dynamically select a first equipment, for example the passive reflector device 102(1), based on a first set of criteria. The first set of criteria may correspond to, but not limited to, a location of the passive reflector device 102(1), a relative distance of passive reflector device 102(1) with respect to the base station 104, a type of the first physical obstructing object that may completely block the plurality of RF signals, and a passive reflection (i.e. merely deflection at a certain angle without adjustment of amplitude gain or phase shift) of the received plurality of RF signals.

The base station 104 may be further configured to dynamically select a second equipment, for example the active reflector device 102(2), based on a second set of criteria. The second set of criteria may correspond to a location of the active reflector device 102(2), a relative distance of active reflector device 102(2) with respect to the base station 104 and the passive reflector device 102(1), a type of the second physical obstructing object that may partially block the plurality of RF signals, remaining uncovered radio path with respect to the CPE 106, and an active reflection of the received plurality of RF signals (with adjustment of amplitude gain and phase shift). The base station 104 may comprise a control device that may be configured to coordinate communication of configuration information to configure or reconfigure the active reflector device 102(2).

With reference to FIG. 1, the base station 104 may be configured to transmit the plurality of RF signals to the selected passive reflector device 102(1) via the first radio signal path 110(1). The base station 104 may dynamically select the passive reflector device 102(1) to provide the first bounce point 112(1). The passive reflector device 102(1) may be configured to receive the plurality of RF signals via the first radio signal path 110(1) and passively transmit the received plurality of RF signals toward the active reflector device 102(2) via the second radio signal path 110(2).

The dynamically selected active reflector device 102(2) may be configured to provide the second bounce point 112(2) to the plurality of RF signals received from the passive reflector device 102(1). The active reflector device 102(2) may be configured to receive the plurality of RF signals from the passive reflector device 102(1) via the second radio signal path 110(2). The active reflector device 102(2) may be configured to provide an amplitude gain and steer the incident plurality of RF signals based on the phase shift provided by a plurality of phase shifters in the active reflector device 102(2). The active reflector device 102(2) may actively transmit the directed beam to the CPE 106 via a third radio signal path 110(3). It may be noted that the passive reflector device 102(1) is selected at the first bounce point 112(1) as the beam of RF signals was only required to be deflected at a certain angle and the amplitude gain was not required. However, the active reflector device 102(2) is selected at the second bounce point 112(2) as the beam of RF signals was required to be steered at a certain angle. Further, a specific amplitude gain was required so that the beam of RF signals can pass through the tinted glass of the window of the customer premises 108 to be received by the CPE 106. It may be further noted that the above exemplary embodiment, according to which the RF communication is performed between the base station 104 and the CPE 106, through the passive reflector device 102(1) and the active reflector device 102(2), should not construed to be limiting the scope of the disclosure. Various other embodiments, according to which the RF communication is performed between the base station 104 and the CPE 106, through more than one passive reflector device 102 and more than one active reflector device, dynamically selected by the base station 104 for providing optimized NLOS coverage, may be possible without deviation from the scope of the disclosure.

Figure 2:
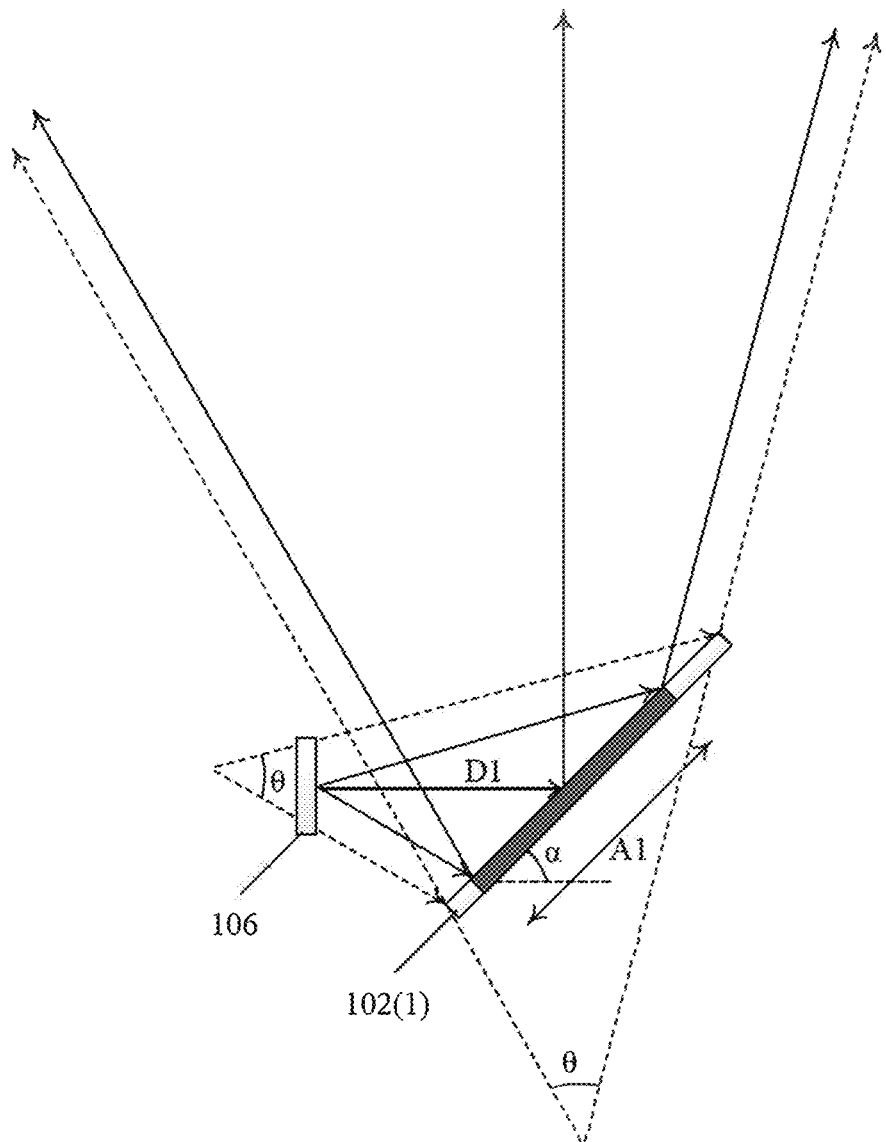
FIG. 2 illustrates an exemplary passive reflector device, in accordance with an exemplary embodiment of the disclosure.

FIG. 2 illustrates an exemplary passive reflector device with respect to a base station and a CPE, in accordance with an exemplary embodiment of the disclosure. With reference to FIG. 2, there is shown the passive reflector device 102(1) of the plurality of reflector devices 102, the base station 104, and the CPE 106. The distance between the CPE 106 and the passive reflector device 102(1) may be indicated by "D1". The scan angle may be indicated by "θ" and the incident angle of the passive reflector device 102(1) may be indicated by "α". Accordingly, the size, indicated by "A1", of the passive reflector device 102(1) may be determined based on equation (1) as follows:

$$A1 = D1 * \sin(\theta)/\sin(\alpha) \tag{1}$$

In an exemplary instance, if the scanning angle "θ" is "30 degree", the distance "D1" between the CPE 106 and the passive reflector device 102(1) is "10 meter", and the incident angle "α" is "45 degree", then the reflector size "A1" may be calculated, based on the equation (1), as "7.1 meter". In another exemplary instance, if the scanning angle "θ" is "30 degree", the distance "D1" between the CPE 106 and the passive reflector device 102(1) is "1 meter", and the incident angle "α" is "45 degree", then the reflector size "A1" may be calculated, based on the equation (1), as "71 centimeter". In yet another exemplary instance, if the scanning angle "θ" is "3 degree", the distance "D1" between the CPE 106 and the passive reflector device 102(1) is "10 meter", and the incident angle "α" is "45 degree", then the reflector size "A1" may be calculated, based on the equation (1), as "74 centimeter".

Figure 3A:
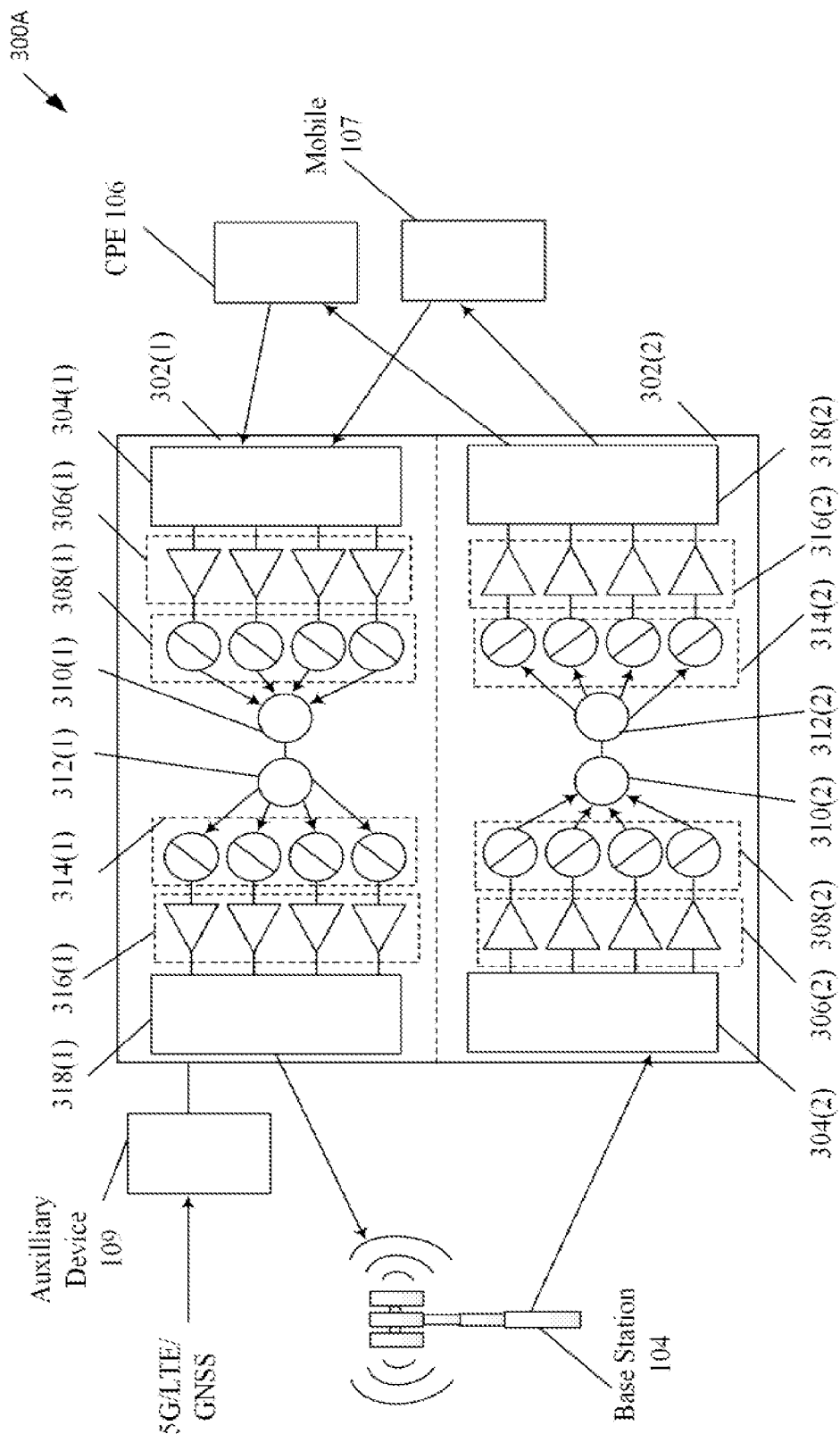
FIG. 3A illustrates a block diagram of an exemplary RF active reflector device, in accordance with an exemplary embodiment of the disclosure.

FIG. 3A illustrates a block diagram of an exemplary RF active reflector device, in accordance with an exemplary embodiment of the disclosure. With reference to FIG. 3A, there is shown a first block diagram 300A for an instance when the active reflector device 102(2) of the plurality of reflector devices 102 is communicatively coupled with the CPE 106, a mobile communication device (mobile) 107, and the base station 104. Notwithstanding, the disclosure is not so limited, and another embodiment, in another instance when the active reflector device 102(2) is communicatively coupled with the CPE 106, the mobile communication device, and another reflector device, such as the passive reflector device 102(1) or another active reflector device, functionally similar to the described embodiment below is possible, without deviation from the scope of the disclosure. The mobile communication device may be, for example, a smartphone, tablet, phablet, a laptop or PC, personal communicator, a handheld or a wearable communication device. As the mobile communication device 107 moves within a certain coverage area of the active reflector device 102(2), the active reflector may be configured to optimize the communication link(s) between the mobile communication device 107 and the active reflector device 102(2) to provide coverage for the mobile communication device 107.

With reference to FIG. 3A, the active reflector device 102(2) may include two (dual) pluralities of circuits 302(1) and 302(2) for two-way communication between the CPE 106, the mobile 107, and the base station 104. The first plurality of circuits 302(1) includes a first receiver front-end and a first transmitter front-end. The first receiver front-end and the first transmitter front-end may be isolated from each other at a specified distance. Based on the isolation, the selection of active elements in the first plurality of circuits 302(1) may be controlled and customized according to desired configuration. The first receiver front-end may include a first receiver array 304(1), a first plurality of low-noise amplifiers (LNAs) 306(1), a first plurality of receiver front-end phase shifters 308(1), and a first combiner 310(1). The first transmitter front-end may include a first splitter 312(1), a first plurality of transmitter front-end phase shifters 314(1), a first plurality of power amplifiers (PAs) 316(1), and a first transmitter array 318(1).

Likewise, the second plurality of circuits 302(2) includes a second receiver front-end and a second transmitter front-end. The second receiver front-end and the second transmitter front-end may be isolated from each other at a specified distance so that the selection of active elements in the second plurality of circuits 302(2) may be controlled and customized according to desired configuration. The second receiver front-end may include a second receiver array 304(2), a second plurality of LNAs 306(2), a second plurality of receiver front-end phase shifters 308(2), and a second combiner 310(2). The second transmitter front-end may further include a second splitter 312(2), a second plurality of transmitter front-end phase shifters 314(2), a second plurality of PAs 316(2), and a second transmitter array 318(2).

It may be noted that, for brevity, there is shown one base station, i.e. the base station 104, is shown to be associated with the first transmitter array 318(1) and the second receiver array 304(2) via single beams. Similarly, one CPE, i.e. the CPE 106, is shown to be associated with the first receiver array 304(1) and the second transmitter array 318(2) via single beams. Notwithstanding, the disclosure may not be so limited, and via multiple beams, the first transmitter array 318(1) and the second receiver array 304(2) may be associated with more than one base station, and likewise, the first receiver array 304(1) and the second transmitter array 318(2) may be associated with more than one CPE, without deviation from the scope of the disclosure.

In accordance with an embodiment, the first plurality of circuits 302(1) in the active reflector device 102(2) may be activated when the active reflector device 102(2) receives a plurality of RF signals from the CPE 106 to be transmitted to the base station 104 (or another reflector device). In accordance with another embodiment, the second plurality of circuits 302(2) in the active reflector device 102(2) may be activated when the active reflector device 102(2) receives the plurality of RF signals from the base station 104 (or another reflector device) to be transmitted to the CPE 106.

In accordance with an embodiment, the first receiver array 304(1) of the active reflector device 102(2) may be configured to receive the plurality of RF signals from the CPE 106 via a first radio path, "P1", of an NLOS radio path over a communication network, for example the mmWave communication network. Consequently, the active reflector device 102(2) may activate the first plurality of circuits 302(1). The first plurality of LNAs 306(1) in the first plurality of circuits 302(1) may be configured to adjust a first amplification gain of each of the received plurality of RF signals. In other words, the first plurality of LNAs 306(1) amplify low-power RF signals without significantly degrading corresponding signal-to-noise (SNR) ratio. Next, the first plurality of receiver front-end phase shifters 308(1) may be configured to perform a first phase shift on each of the plurality of RF signals with the adjusted first amplification gain. Accordingly, the received plurality of RF signals interfere to generate a directed receiver gain. Next, the first combiner 310(1), which comprises both active and passive combiners, may be configured to combine the plurality of RF signals on which first amplification gain has been adjusted and thereafter, the first phase shift has been performed. The combined RF signals may be communicated to the first transmitter front-end of the first plurality of circuits 302(1) that is isolated from the first receiver front-end of the first plurality of circuits 302(1).

The first splitter 312(1) in the first transmitter front-end of the first plurality of circuits 302(1) may be configured to split the received combined plurality of RF signals. In accordance with an embodiment, the first splitter 312(1) may comprise an input differential pair and two cascode pairs that evenly split the output current into two branches. The first splitter 312(1) may further compensate for RF signal loss to achieve an efficient RF power transfer. Next, the first plurality of transmitter front-end phase shifters 314(1) may be configured to receive the split RF signals and perform a second phase shift on each of the split RF signals for beam steering of the plurality of RF signals. Next, the first plurality of PAs 316(1) may be configured to adjust a second amplification gain of each of the plurality of RF signals on which second phase shift has been performed. The second amplification gain of each of the plurality of RF signals may be adjusted based on a measured power of the beam of RF signals provided by the first plurality of PAs 316(1). The amplification gain adjustment may compensate for observed deviations of the output beam of the plurality of RF signals from an optimal power.

Finally, the first transmitter array 318(1) may be configured to transmit the plurality of RF signals with the adjusted second amplification gain to the base station 104 (or another reflector device) as the directed RF beam. The first transmitter array 318(1) may transmit the directed beam of RF signals via a second radio path, "P2", of the NLOS radio path.

In accordance with another embodiment, the second receiver array 304(2) of the active reflector device 102(2) may be configured to receive a plurality of RF signals from the base station 104 (or another reflector device) via a third radio path, "P3", of the NLOS radio path over the mmWave communication network. Consequently, the active reflector device 102(2) may activate the second plurality of circuits 302(2). The functionality of the various elements in the second plurality of circuits 302(2) is similar to the functionality of the corresponding elements in the first plurality of circuits 302(1), which has been described above in detail. As the final operation, the second transmitter array 318(2) may be configured to transmit the plurality of RF signals with the adjusted second amplification gain to the CPE 106 as the directed RF beam. The second transmitter array 318(2) may transmit the directed beam of RF signals via a fourth radio path, "P4", of the NLOS radio path.

FIG. 3A also illustrates an auxilary device 109 that is communicatively coupled to the active reflector device 102(2). The auxiliary device 109 communicates outside the signal path. For example, the auxiliary signal path may communimcate with a 5G system, a long term evolution system (LTE), a global navigation satellite system (GNSS) such as global positioning system (GPS), GLONASS, wireless wide area network (WWAN), wireless metropolitan area network (WMAN), wireless local area network (WLAN), and other types of wireless systems and/or technologies. In one exemplary embodiment of the disclosure, the auxiliary device 109 may be configured to synchronize with and acquire timing information and frame structure information from the 5G system and the acquired information may be utilized to configure, for example, beam training and/or beamforming parameters for the two (dual) pluralities of circuits 302(1) and 302(2) in order to provide two-way communication between the CPE 106, and/or the mobile communication device 107, and the base station 104. In another exemplary embodiment of the disclosure, the auxiliary device 109 may be configured to synchronize with and acquire timing information and frame structure information from the LTE system and the acquired information may be utilized to configure, for example, beam training and/or beamforming parameters for the dual pluralities of circuits 302(1) and 302(2) to provide two-way communication between the CPE 106, and/or the mobile communication device 107, and the base station 104. In another exemplary embodiment of the disclosure, the auxiliary device 109 may be configured to acquire location information GNSS and the acquired information may be utilized to configure, for example, beam training and/or beamforming parameters for the two (dual) pluralities of circuits 302(1) and 302(2) for two-way communication between the CPE 106, and/or the mobile communication device 107, and the base station 104. In this regard, location specific parameters may be utilized to configure the dual pluralities of circuits 302(1) and 302(2).

In accordance with various embodiments of the disclosure, the beam training may be utilized to provide optimal communication between for example, the base station 104, and the CPE 106 and/or the mobile communication device 109. For example, beam training may be utilized to provide a certain quality of service (QoS) and/or provide a specified link budget. Due to high path loss between the base station 104 and the actve reflector device 102(2), a more narrowly focused bean with high power may be utilized to facilitate communication between the base station 104 and the actve reflector device 102(2). However, due to low path loss between the actve reflector device 102(2) and the CPE 106 and/or the mobile communication device 109, a plurality of broader beams with much lower power may be utilized to facilitate communication between the actve reflector device 102(2) and the CPE 106 and/or the mobile communication device 109. In accordance with an embodiment of the disclosure, the same data may be blasted via the plurality of beams from the actve reflector device 102(2) the the CPE 106 and/or the mobile communication device 109.

Figure 3B:
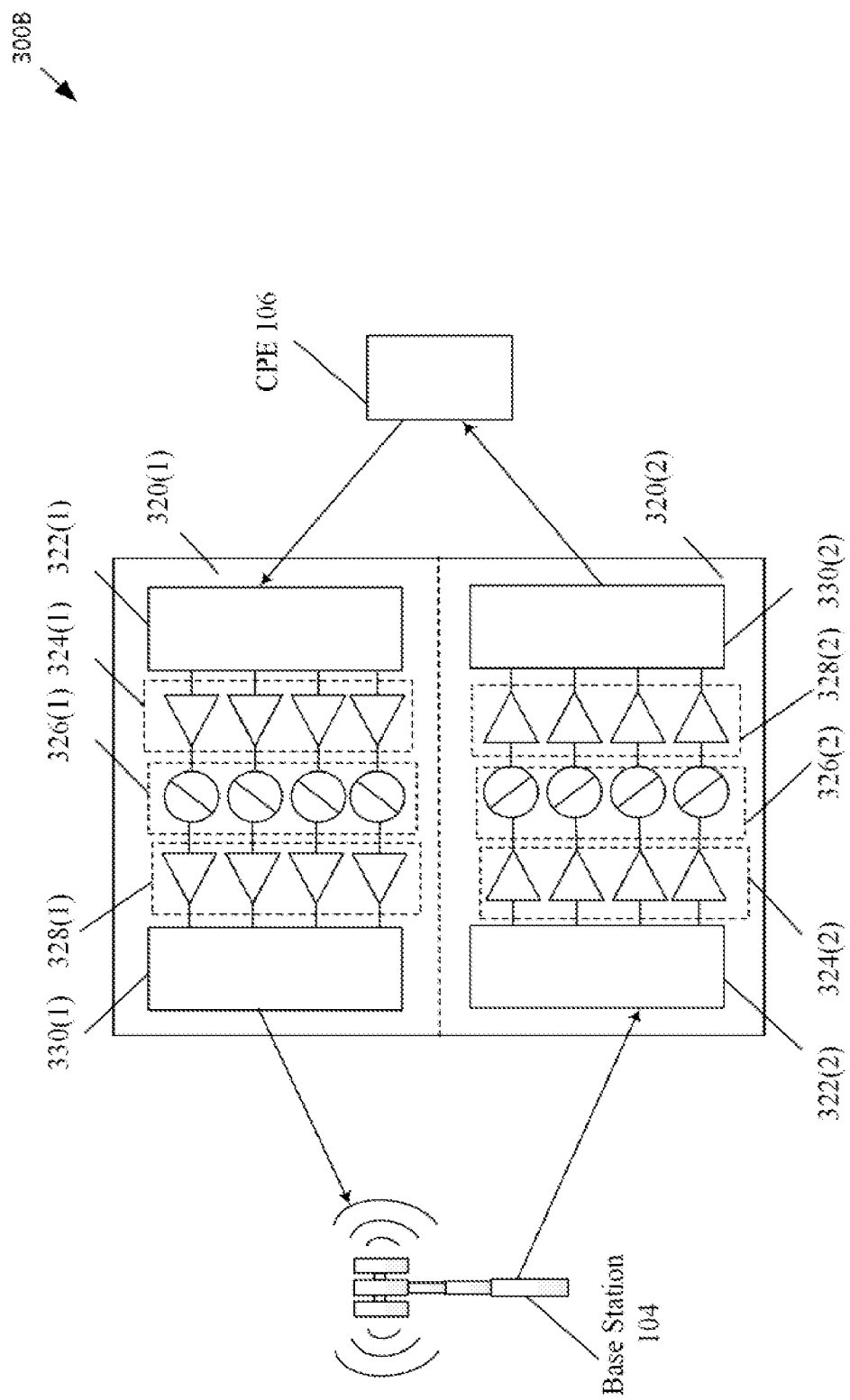
FIG. 3B illustrates a block diagram of another exemplary RF active reflector device, in accordance with an exemplary embodiment of the disclosure.

FIG. 3B illustrates a block diagram of another exemplary RF active reflector device, in accordance with an exemplary embodiment of the disclosure. With reference to FIG. 3B, there is shown a second block diagram 300B for an instance when the active reflector device 102(2) of the plurality of reflector devices 102 is communicatively coupled with the CPE 106 and the base station 104. Notwithstanding, the disclosure is not so limited, and another embodiment, in another instance when the active reflector device 102(2) is communicatively coupled with the CPE 106 and another reflector device, such as the passive reflector device 102(1) or another active reflector device, functionally similar to the described embodiment below is possible, without deviation from the scope of the disclosure. It may be noted that the active reflector device 102(2), as shown in FIG. 3B, is comparatively less complex and more compact as compared to the active reflector device 102(2), as shown in FIG. 3A. However, the functionality of the common elements are similar in both the block diagrams 300A and 300B illustrated in FIGS. 3A and 3B, respectively.

With reference to FIG. 3B, the active reflector device 102(2) may include two pluralities of circuits 320(1) and 320(2) for two-way communication between the CPE 106 and the base station 104. The first plurality of circuits 320(1) includes a first receiver array 322(1), a first plurality of LNAs 324(1), a first plurality of phase shifters 326(1), a first plurality of PAs 328(1), and a first transmitter array 330(1). Likewise, the second plurality of circuits 320(2) includes a second receiver array 322(2), a second plurality of LNAs 324(2), a second plurality of phase shifters 326(2), a second plurality of PAs 328(2), and a second transmitter array 330(2). It may be noted that the first receiver array 322(1), the first plurality of LNAs 324(1), and the first plurality of PAs 328(1) may be functionally similar to the first receiver array 304(1), the first plurality of LNAs 306(1), and the first plurality of PAs 316(1) (in FIG. 3A), respectively. Although not shown, FIG. 3B may also include the mobile communication device 107 and the the auxiliary device 109.

It may be noted that, for brevity, there is shown one base station, i.e. the base station 104, is shown to be associated with the first transmitter array 330(1) and the second receiver array 322(2) via single beams. Similarly, one CPE, i.e. the CPE 106, is shown to be associated with the first receiver array 322(1) and the second transmitter array 330 (2) via single beams. Notwithstanding, the disclosure may not be so limited, and via multiple beams, the first transmitter array 330(1) and the second receiver array 322(2) may be associated with more than one base station, and likewise, the first receiver array 322(1) and the second transmitter array 330(2) may be associated with more than one CPE, without deviation from the scope of the disclosure.

In accordance with an embodiment, the first plurality of circuits 320(1) in the active reflector device 102(2) may be activated when the active reflector device 102(2) receives a plurality of RF signals from the CPE 106 and/or mobile communication device 107 and transmits to the base station 104 (or another reflector device). In accordance with another embodiment, the second plurality of circuits 320(2) in the active reflector device 102(2) may be activated when the active reflector device 102(2) receives the plurality of RF signals from the base station 104 (or another reflector device) and transmits to the CPE 106 and/or mobile communication device 107.

In accordance with an embodiment, the first receiver array 322(1) of the active reflector device 102(2) may be configured to receive the plurality of RF signals from the CPE 106 via a first radio path, "P1", of an NLOS radio path over a communication network, for example the mmWave communication network. Consequently, the active reflector device 102(2) may activate the first plurality of circuits 320(1). The first plurality of LNAs 324(1) in the first plurality of circuits 320(1) may be configured to adjust a first amplification gain of each of the received plurality of RF signals. Next, the first plurality of phase shifters 326(1) may be configured to perform a phase shift on each of the plurality of RF signals with the adjusted first amplification gain. Accordingly, the received plurality of RF signals interfere to generate a directed gain and beam steering of the plurality of RF signals. Next, the first plurality of PAs 328(1) may be configured to adjust a second amplification gain of each of the plurality of RF signals on which phase shift has been performed. The second amplification gain of each of the plurality of RF signals may be adjusted based on a measured power of the beam of RF signals provided by the first plurality of PAs 328(1). The amplification gain adjustment may compensate for observed deviations of the output beam of the plurality of RF signals from an optimal power. Finally, the first transmitter array 330(1) may be configured to transmit the plurality of RF signals with the adjusted second amplification gain to the CPE 106 as the directed RF beam. The first transmitter array 330(1) may transmit the directed beam of RF signals via a second radio path, "P2", of the NLOS radio path.

In accordance with another embodiment, the second receiver array 322(2) of the active reflector device 102(2) may be configured to receive a plurality of RF signals from the base station 104 (or another reflector device) via a third radio path, "P3", of the NLOS radio path over the mmWave communication network. Consequently, the active reflector device 102(2) may activate the second plurality of circuits 320(2). The functionality of the various elements in the second plurality of circuits 320(2) is similar to the functionality of the corresponding elements in the first plurality of circuits 320(1), which has been described above in detail. As the final operation, the second transmitter array 330(2) may be configured to transmit the plurality of RF signals with the adjusted second amplification gain to the CPE 106 as the directed RF beam. The second transmitter array 330(2) may transmit the directed beam of RF signals via a fourth radio path, "P4", of the NLOS radio path.

Figure 3C:
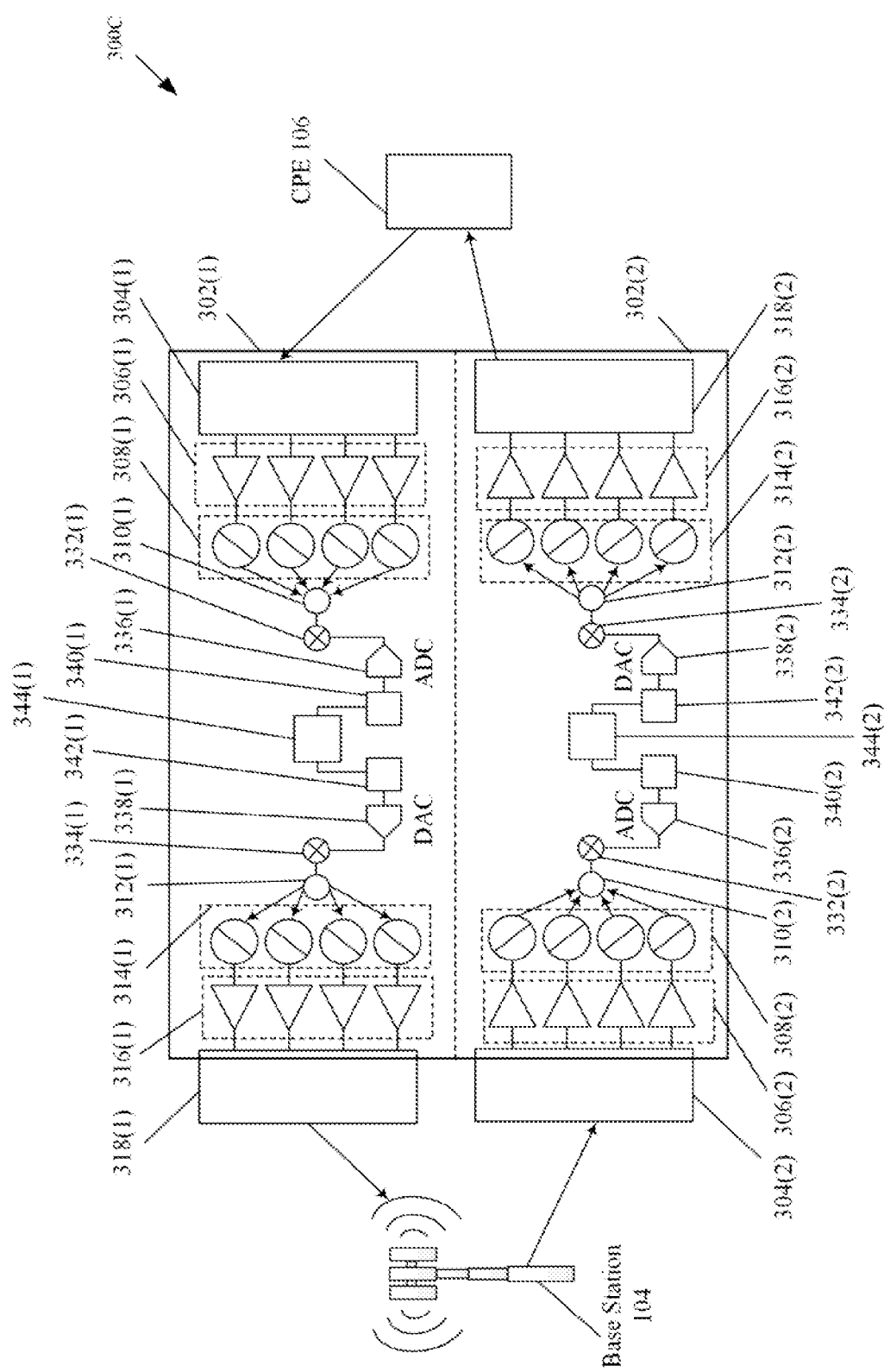
FIG. 3C illustrates a block diagram of an exemplary RF-BB active reflector device, in accordance with an exemplary embodiment of the disclosure.

FIG. 3C illustrates a block diagram of an exemplary RF-BB active reflector device, in accordance with an exemplary embodiment of the disclosure. With reference to FIG. 3C, there is shown a third block diagram 300C for an instance when the active reflector device 102(2) of the plurality of reflector devices 102 is communicatively coupled with the CPE 106 and the base station 104. Notwithstanding, the disclosure is not so limited, and another embodiment, in another instance when the active reflector device 102(2) is communicatively coupled with the CPE 106 and another reflector device, such as the passive reflector device 102(1) or another active reflector device, functionally similar to the described embodiment below is possible, without deviation from the scope of the disclosure. Although not shown, FIG. 3B may also include the mobile communication device 107 and the the auxiliary device 109.

It may be noted that the RF-BB active reflector device 102(2) in FIG. 3C has been explained based on the various components of the active reflector device 102(2), as illustrated in FIG. 3A. Two additional elements in the block diagram of the RF-BB active reflector device 102(2) are a first demod-mixer 332(1), a first mod-mixer 334(1)), a first analog to digital converter (ADC) 336(1), a first digital to analog converter (DAC) 338(1), a first digital demodulator 340(1), a first digital modulator 342(1), and a first outphasing decomposition unit 344(1) in the first plurality of circuits 302(1). Likewise, the second plurality of circuits 302(2) may comprise a second demod-mixer 332(2), a second mod-mixer 334(2), a second ADC 336(2), a second DAC 338(2), a second digital demodulator 340(2), a second digital modulator 342(2), and a second outphasing decomposition unit 344(2). Additional information on outphasing may be found in application Ser. No. 15/432,091, which was filed on Feb. 14, 2017, entitled "Outphasing Transmitters with Improved Wireless Transmission Performance and Manufacturability," and which is incorporated herein by reference.

Similar to the description of FIG. 3A, FIG. 3C describes that the first plurality of circuits 302(1) includes the first receiver front-end and the first transmitter front-end. The first receiver front-end and the first transmitter front-end may be isolated from each other at a specified distance. Based on the isolation, the selection of active elements in the first plurality of circuits 302(1) may be controlled and customized according to desired configuration.

It may be noted that, for brevity, there is shown one base station, i.e. the base station 104, is shown to be associated with the first transmitter array 318(1) and the second receiver array 304(2) via single beams. Similarly, one CPE, i.e. the CPE 106, is shown to be associated with the first receiver array 304(1) and the second transmitter array 318(2) via single beams, and one mobile, i.e. the mobile communication device 107, is shown to be associated with the first receiver array 304(1) and the second transmitter array 318(2) via single beams. Notwithstanding, the disclosure may not be so limited, and via multiple beams, the first transmitter array 318(1) and the second receiver array 304(2) may be associated with more than one base station, and likewise, the first receiver array 304(1) and the second transmitter array 318(2) may be associated with more than one CPE and/or the mobile communication device 107, without deviation from the scope of the disclosure.

In accordance with an embodiment, the first plurality of circuits 302(1) in the active reflector device 102(2) may be activated when the active reflector device 102(2) receives the plurality of RF signals from the CPE 106 and/or the mobile communication device 107, and transmits to the base station 104 (or another reflector device). In accordance with another embodiment, the second plurality of circuits 302(2) in the active reflector device 102(2) may be activated when the active reflector device 102(2) receives the plurality of RF signals from the base station 104 (or another reflector device) and transmits to the CPE 106 and/or the mobile communication device 107.

In accordance with an embodiment, the first receiver array 304(1) of the active reflector device 102(2) may be configured to receive the plurality of RF signals from the CPE 106 via a first radio path, "P1", of an NLOS radio path over a communication network, for example the mmWave communication network. Consequently, the active reflector device 102(2) may activate the first plurality of circuits 302(1). The first plurality of LNAs 306(1) in the first plurality of circuits 302(1) may be configured to adjust a first amplification gain of each of the received plurality of RF signals. In other words, the first plurality of LNAs 306(1) amplifies low-power RF signals without significantly degrading corresponding SNR ratio. Next, the first plurality of receiver front-end phase shifters 308(1) may be configured to perform a first phase shift on each of the plurality of RF signals with the adjusted first amplification gain. Accordingly, the received plurality of RF signals interfere to generate a directed receiver gain. Next, the first combiner 310(1), which comprises both active and passive combiners, may be configured to combine the plurality of RF signals on which first amplification gain has been adjusted and thereafter, the first phase shift has been performed. The combined RF signals may be communicated to the first transmitter front-end of the first plurality of circuits 302(1) that is isolated from the first receiver front-end of the first plurality of circuits 302(1).

Based on the combined RF signals (on which first amplification gain has been adjusted and thereafter, the first phase shift has been performed) and an oscillator signal, the first demodmixer 332(1) may be configured to determine baseband signals. The determined baseband signals may be converted to digital domain by the first ADC 336(1) and then demodulated using the first digital demodulator 340(1). Thereafter, the first outphasing decomposition unit 344(1) may decompose variable amplitudes (or variable envelope) of the baseband signals into constant amplitude (or constant envelope) decomposed digital signals, also referred to as "outphasing." A digital signal processor (DSP) in the first outphasing decomposition unit 344(1) may determine the constant amplitude decomposed digital signals. The constant amplitude decomposed digital signals may have a single constant amplitude level in one implementation. In another implementation the constant amplitude decomposed digital signals may have a finite number of discrete amplitude levels. The DSP may be implemented, for example, using a field-programmable gate array (FPGA) or an ASIC chip. The constant amplitude decomposed digital signals are communicated to the first digital modulator 342(1) in the first transmitter front-end.

Thereafter, the first digital modulator 342(1) may again modulate the constant amplitude decomposed digital signals and the DAC 338(1) may convert the modulated constant amplitude decomposed digital signals to constant amplitude decomposed analog signals. The advantage of the aforesaid steps of conversion into digital signals, demodulation, modulation and conversion into analog signals is to avoid amplification of analog noise and interference in the relay operation.

The constant amplitude decomposed analog signals may be communicated to the first mod-mixer 334(1). The first mod-mixer 334(1) may modulate the constant amplitude decomposed analog signals and convert into constant amplitude RF signals. Consequently, the constant amplitude RF signals may be further communicated to the first splitter 312(1).

The first splitter 312(1) in the first transmitter front-end of the first plurality of circuits 302(1) may be configured to split the constant amplitude RF signals received from the first mod-mixer 334(1). In accordance with an embodiment, the first splitter 312(1) may comprise an input differential pair and two cascode pairs that evenly split the output current into two branches. The first splitter 312(1) may further compensate for RF signal loss to achieve an efficient RF power transfer. Next, the first plurality of transmitter front-end phase shifters 314(1) may be configured to receive the split RF signals and perform a second phase shift on each of the split RF signals for beam steering of the plurality of RF signals. Next, the first plurality of PAs 316(1) may be configured to adjust a second amplification gain of each of the plurality of RF signals on which second phase shift has been performed. The second amplification gain of each of the plurality of RF signals may be adjusted based on a measured power of the beam of RF signals provided by the first plurality of PAs 316(1). The amplification gain adjustment may compensate for observed deviations of the output beam of the plurality of RF signals from an optimal power. The first plurality of PAs 316(1) may be placed sufficiently apart from each other and provided respective RF shields to minimize inter-modulation or interference between two PAs. Due to the decomposition of the variable amplitude composite baseband signal into constant amplitude decomposed plurality of RF signals, the first plurality of PAs 316(1) may operate with more power efficiency, less non-linearity, less distortion, and at a lower back off.

Finally, the first transmitter array 318(1) may be configured to transmit the plurality of RF signals with the adjusted second amplification gain, using vertically-polarized port or horizontally polarized port, to the base station 104 (or another reflector device) as the directed RF beam. The first transmitter array 318(1) may transmit the directed beam of RF signals via the second radio path, "P2", of the NLOS radio path.

In accordance with another embodiment, the second receiver array 304(2) of the active reflector device 102(2) may be configured to receive RF signals from the base station 104 (or another reflector device) via the third radio path, "P3", of the NLOS radio path over the mmWave communication network. Consequently, the active reflector device 102(2) may activate the second plurality of circuits 302(2). The functionality of the various elements, including the second demod-mixer 332(2) and the second mod-mixer 334(2), in the second plurality of circuits 302(2) is similar to the functionality of the corresponding elements in the first plurality of circuits 302(1), which has been described above in detail. As the final operation, the second transmitter array 318(2) may be configured to transmit the plurality of RF signals with the adjusted second amplification gain to the CPE 106 as the directed RF beam. The second transmitter array 330(2) may transmit the directed beam of RF signals via the fourth radio path, "P4", of the NLOS radio path.

Figure 4:
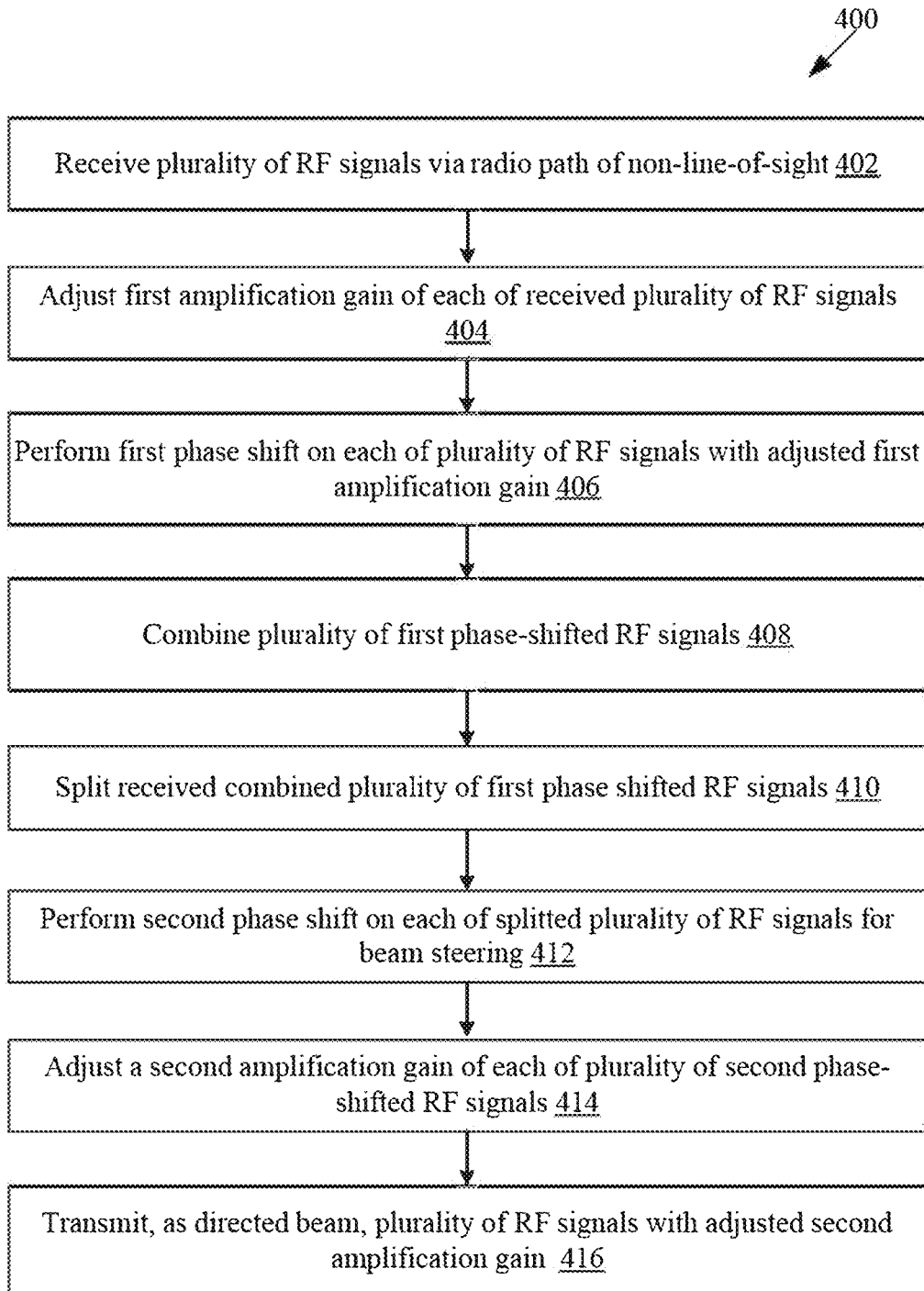
FIG. 4 depicts a flow chart illustrating exemplary operations for an exemplary active reflector device, in accordance with an exemplary embodiment of the disclosure.

FIG. 4 depicts a flow chart illustrating exemplary operations for an exemplary active reflector device, in accordance with an exemplary embodiment of the disclosure. The exemplary operations in FIG. 4 are explained in conjunction with FIGS. 1, 2, and 3A to 3C. Referring to FIG. 4, there is shown a flow chart 400 comprising exemplary operations 402 through 416.

At 402, a plurality of RF signals may be received via a radio path of an NLOS radio path over a communication network. The first receiver array 304(1) at the first receiver front-end of the first plurality of circuits 302(1) of the active reflector device 102(2) may be configured to receive the plurality of RF signals from the CPE 106 via a first radio path, "P1", of the NLOS radio path over the mmWave communication network. Consequently, the active reflector device 102(2) may activate the first plurality of circuits 302(1).

At 404, a first amplification gain of each of the received plurality of RF signals may be adjusted. The first plurality of LNAs 306(1) in the first plurality of circuits 302(1) may be configured to adjust the first amplification gain of each of the received plurality of RF signals. In other words, the first plurality of LNAs 306(1) amplifies low-power RF signals of the plurality of RF signals without significantly degrading corresponding SNR ratio.

At 406, a first phase shift may be performed on each of the plurality of RF signals with the adjusted first amplification gain. The first plurality of receiver front-end phase shifters 308(1) may be configured to perform the first phase shift on each of the plurality of RF signals with the adjusted first amplification gain. Accordingly, the received plurality of RF signals interfere to generate a directed receiver gain.

At 408, the plurality of first phase-shifted RF signals, received from the plurality of the first plurality of receiver front-end phase shifters 308(1), may be combined. The first combiner 310(1), which comprises both active and passive combiners, may be configured to combine the plurality of RF signals on which first amplification gain has been adjusted and thereafter, the first phase shift has been performed. The combined RF signals may be communicated to the first transmitter front-end of the first plurality of circuits 302(1). The first transmitter front-end of the first plurality of circuits 302(1) is isolated from the first receiver front-end of the first plurality of circuits 302(1). In accordance with an embodiment, based on the combined RF signals (on which first amplification gain has been adjusted and thereafter, the first phase shift has been performed) and an oscillator signal, the first demod-mixer 332(1) may be configured to determine baseband signals.

The determined baseband signals may be converted to digital domain by the first ADC 336(1) and then demodulated using the first digital demodulator 340(1). Thereafter, the first outphasing decomposition unit 344(1) may decompose variable amplitudes (or variable envelope) of the baseband signals into constant amplitude (or constant envelope) decomposed digital signals, also referred to as "outphasing." A digital signal processor (DSP) in the first outphasing decomposition unit 344(1) may determine the constant amplitude decomposed digital signals. The constant amplitude decomposed digital signals may have a single constant amplitude level in one implementation. In another implementation, the constant amplitude decomposed digital signals may have a finite number of discrete amplitude levels. The DSP may be implemented, for example, using a field-programmable gate array (FPGA) or an ASIC chip. The constant amplitude decomposed digital signals are communicated to the first digital modulator 342(1) in the first transmitter front-end.

Thereafter, the first digital modulator 342(1) may again modulate the constant amplitude decomposed digital signals and the DAC 338(1) may convert the modulated constant amplitude decomposed digital signals to constant amplitude decomposed analog signals. The constant amplitude decomposed analog signals may be communicated to the first mod-mixer 334(1). The first mod-mixer 334(1) may modulate the constant amplitude decomposed analog signals and convert into constant amplitude RF signals. Consequently, the constant amplitude RF signals may be further communicated to the first splitter 312(1).

At 410, the constant amplitude RF signals received at the first transmitter front-end of the first plurality of circuits 302(1) may be split. The first splitter 312(1) in the first transmitter front-end of the first plurality of circuits 302(1) may be configured to split the received combined RF signals. In accordance with an embodiment, the first splitter 312(1) may comprise an input differential pair and cascode pairs that evenly split the output current into two branches. The first splitter 312(1) may further compensate for RF signal loss to achieve an efficient RF power transfer of the plurality of RF signals.

At 412, a second phase shift may be performed on each of the split RF signals for beam steering of the plurality of RF signals. The first plurality of transmitter front-end phase shifters 314(1) may be configured to receive the split RF signals and perform a second phase shift on each of the split RF signals for beam steering of the plurality of RF signals.

At 414, a second amplification gain of each of the plurality of RF signals (on which second phase shift has been performed) may be adjusted. The first plurality of PAs 316(1) may be configured to adjust the second amplification gain of each of the plurality of RF signals on which second phase shift has been performed. The second amplification gain of each of the plurality of RF signals may be adjusted based on a measured power of the beam of RF signals provided by the first plurality of PAs 316(1). The amplification gain adjustment may compensate for observed deviations of the output beam of the plurality of RF signals from an optimal power.

At 416, the plurality of RF signals, as the directed RF beam, with the adjusted second amplification gain may be transmitted. In accordance with an embodiment, the first transmitter array 318(1) may be configured to transmit the plurality of RF signals with the adjusted second amplification gain, as the directed RF beam, to the base station 104. In another embodiment, the first transmitter array 318(1) may be configured to transmit the plurality of RF signals with the adjusted second amplification gain, as the directed RF beam, to a passive reflector device, such as the passive reflector device 102(1). In yet another embodiment, the first transmitter array 318(1) may be configured to transmit the plurality of RF signals with the adjusted second amplification gain, as the directed RF beam, to another active reflector device. The first transmitter array 318(1) may transmit the directed beam of RF signals via a radio path, such as the second radio path, "P2", of the NLOS radio path.

Figure 5:
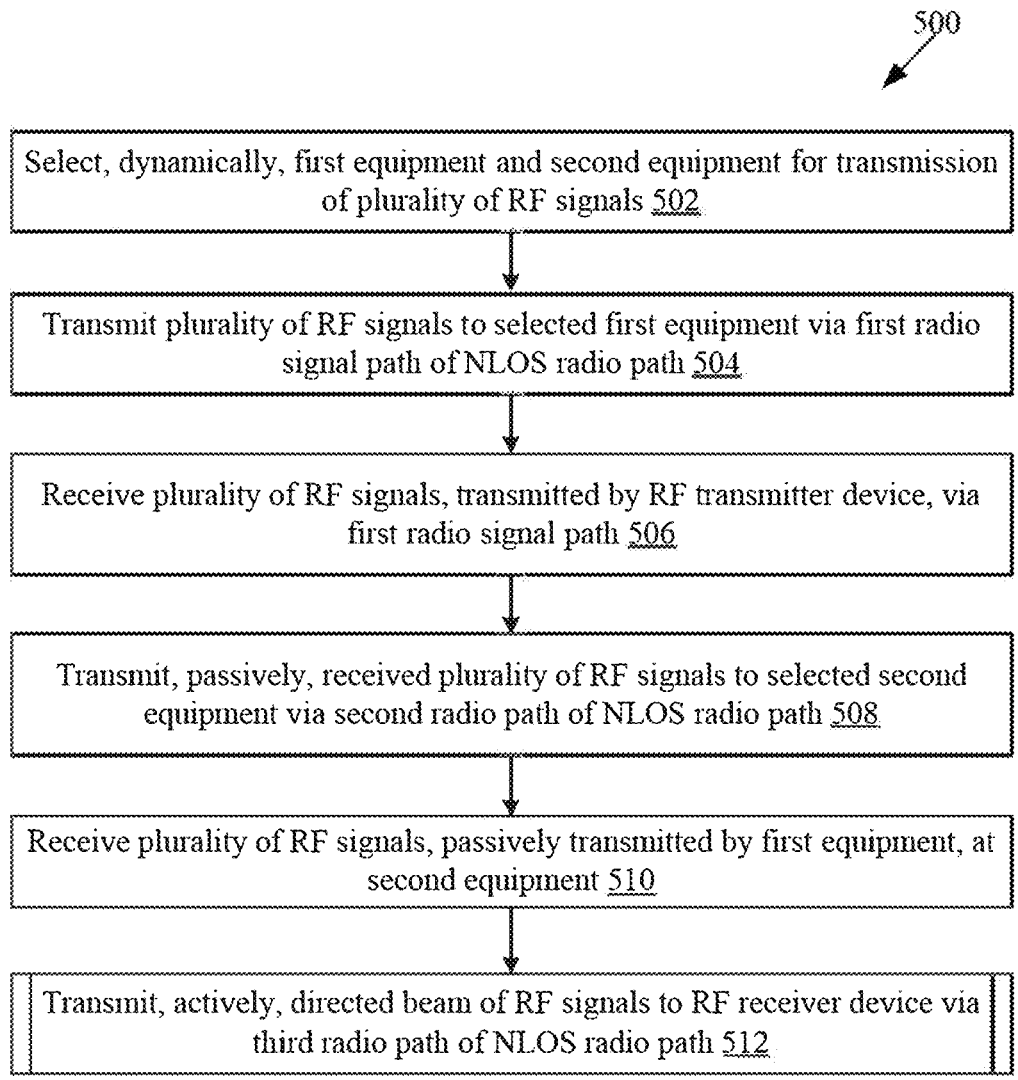
FIG. 5 depicts a flow chart illustrating exemplary operations for an exemplary system for providing an NLOS coverage for a communication network, in accordance with an exemplary embodiment of the disclosure.

FIG. 5 depicts a flow chart illustrating exemplary operations for an exemplary system for providing an NLOS coverage for a communication network, in accordance with an exemplary embodiment of the disclosure. The exemplary operations in FIG. 5 are explained in conjunction with FIGS. 1, 2, and 3A to 3C. Referring to FIG. 5, there is shown a flow chart 500 comprising exemplary operations 502 through 512.

At 502, a first equipment and a second equipment may be selected for transmission of a plurality of RF signals to the RF receiver. The base station 104 may dynamically select the first equipment, for example the passive reflector device 102(1), based on a first set of criteria. The first set of criteria may correspond to, but not limited to, a location of the passive reflector device 102(1), a relative distance of passive reflector device 102(1) with respect to the base station 104, a type of the first physical obstructing object that may completely block the plurality of RF signals, and a passive reflection (i.e. merely deflection at a certain angle without adjustment of amplitude gain or phase shift) of the received plurality of RF signals.

The base station 104 may be further configured to dynamically select the second equipment, for example the active reflector device 102(2), based on a second set of criteria. The second set of criteria may correspond to a location of the active reflector device 102(2), a relative distance of active reflector device 102(2) with respect to the base station 104 and the passive reflector device 102(1), a type of the second physical obstructing object that may partially block the plurality of RF signals, remaining radio path with respect to the CPE 106, and an active reflection of the received plurality of RF signals (with adjustment of amplitude gain and phase shift). The base station 104 may comprise a control device that may be configured to coordinate communication of configuration information to configure or reconfigure the active reflector device 102(2).

It may be noted that the passive reflector device 102(1) is selected to provide the first bounce point 112(1) as the beam of RF signals is only required to be deflected at a certain angle and the amplitude gain is not required. Further, the active reflector device 102(2) is selected to provide the second bounce point 112(2) as the beam of RF signals are required to be steered at a certain angle. Further, a specific amplitude gain is required so that the beam of RF signals can pass through partial physical obstructing objects, such as the tinted glass of the window of the customer premises 108, to be received by the CPE 106.

At 504, the plurality of RF signals may be transmitted to the selected first equipment via the first radio signal path of the NLOS radio path. The base station 104 may transmit the plurality of RF signals to the selected passive reflector device 102(1) via the first radio signal path 110(1).

At 506, the plurality of RF signals, transmitted by the RF transmitter, may be received at the first equipment, via the first radio signal path. The passive reflector device 102(1) may be configured to receive the plurality of RF signals from the base station 104 at an incident angle. The passive reflector device 102(1) may provide the first bounce point 112(1) to the plurality of RF signals in transmission.

At 508, the received plurality of RF signals may be passively transmitted to a second equipment via the second radio path of the NLOS radio path. The passive reflector device 102(1) may be further configured to passively transmit the plurality of RF signals toward the active reflector device 102(2) via the second radio signal path 110(2).

At 510, the plurality of RF signals, passively transmitted by the first equipment, may be received at the second equipment. The active reflector device 102(1) may provide the second bounce point 112(2) to the plurality of RF signals in transmission.

At 512, a directed beam of RF signals may be actively transmitted to the RF receiver device via the third radio path of the NLOS radio path. The active reflector device 102(2) may be configured to provide an amplitude gain and steer the incident beam of RF signals based on the phase shift provided by a plurality of phase shifters in the active reflector device 102(2). The active reflector device 102(2) may actively transmit the directed beam to the CPE 106 via the third radio signal path 110(3). The exemplary operations 402 through 416 may be executed for 512 in FIG. 5.

Various embodiments of the disclosure may provide a non-transitory computer-readable medium having stored thereon, computer implemented instruction that when executed by a first and a second plurality of circuits causes a system to execute operations to adjust a first amplification gain of each of a plurality of radio frequency (RF) signals received at a receiver front-end from a first equipment, for example the CPE 106, via, for example the first radio path "P1" of an NLOS radio path. A first phase shift may be performed by phase shifters, for example the first plurality of receiver front-end phase shifters 308(1), on each of the plurality of RF signals with the adjusted first amplification gain. A combination of the plurality of first phase-shifted RF signals may be split by a splitter, for example the first splitter 312(1), at a transmitter front-end. A second phase shift on each of the split plurality of first phase-shifted RF signals may be performed by other phase shifters, such as the first plurality of transmitter front-end phase shifters 314(1). A second amplification gain of each of the plurality of second phase-shifted RF signals may be adjusted by PAs, such as the first plurality of PAs 316(1).

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to a central processing unit ("CPU"), microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory any other non-transitory medium including digital, optical, analogue-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system described herein may be included in a semiconductor intellectual property core, such as a microprocessor core (e.g., embodied in HDL) and transformed to hardware in the production of integrated circuits. Additionally, the system described herein may be embodied as a combination of hardware and software. Thus, the present disclosure should not be limited by any of the above-described exemplary embodiments, but should be defined only in accordance with the following claims and their equivalents.

What is claimed is:

1. A system, comprising:
    a first plurality of circuits in a receiver front-end of a reflector device,
        wherein the reflector device is in a vicinity of a physical obstructing object at a line-of-sight (LOS) radio path between a first equipment and a second equipment, and
        wherein the first plurality of circuits are configured to:
            adjust a first amplification gain of each of a plurality of radio frequency (RF) signals received from the first equipment via a first radio path of a non-line-of-sight (NLOS) radio path,
            perform a first phase shift on each of the plurality of RF signals with the adjusted first amplification gain to generate a plurality of first phase-shifted RF signals, and
            communicate a combination of the plurality of first phase-shifted RF signals to a second plurality of circuits, and
        wherein the second plurality of circuits is in a transmitter front-end of the reflector device, the second plurality of circuits are configured to:
            perform a second phase shift on each of the plurality of first phase-shifted RF signals to generate a plurality of second phase-shifted RF signals; and
            transmit the plurality of RF signals as a directed beam to the second equipment via a second radio path of the NLOS radio path,
            wherein the directed beam is transmitted to the second equipment based on the plurality of second phase-shifted RF signals.

2. The system according to claim 1, wherein the second plurality of circuits are further configured to adjust a second amplification gain of each of the plurality of second phase-shifted RF signals.

3. The system according to claim 1, wherein the first plurality of circuits are further configured to create a baseband signal based on demodulation of the combination of the plurality of first phase-shifted RF signals.

4. The system according to claim 3, wherein the system further comprises a third plurality of circuits configured to decompose variable amplitude of the baseband signal into constant amplitude decomposed analog signals.

5. The system according to claim 4, wherein the second plurality of circuits are further configured to create constant amplitude decomposed RF signals based on modulation and mixing of the constant amplitude decomposed analog signals.

6. The system according to claim 1, wherein the receiver front-end of the reflector device is isolated from the transmitter front-end of the reflector device at a specified distance.

7. A system, comprising:
    a radio frequency (RF) transmitter device configured to transmit a plurality of RF signals via a first radio signal path of a non-line-of-sight (NLOS) radio path;
    a first equipment communicatively coupled to the RF transmitter device via the first radio signal path,
        wherein the first equipment is selected based on a first set of criteria,
        wherein the first equipment is configured to:
            receive the plurality of RF signals from the RF transmitter device via the first radio signal path; and
            transmit the received plurality of RF signals via a second radio path of the NLOS radio path, based on a phase shift of each of the plurality of RF signals; and
    a second equipment communicatively coupled to the first equipment over a second radio signal path,
        wherein the second equipment is selected based on a second set of criteria, wherein the second equipment is configured to:
            receive the plurality of RF signals transmitted by the first equipment; and
            transmit a directed beam of RF signals via a third radio path of the NLOS radio path to an RF receiver device,
            wherein the directed beam of RF signals is transmitted based on the received plurality of RF signals.

8. The system according to claim 7, wherein the first equipment is a passive reflector device at an incident angle with respect to the RF transmitter device, wherein the second equipment is an active reflector device, wherein the first equipment and the second equipment are selected by the RF transmitter device.

9. The system according to claim 8, wherein a size of the first equipment is based on the incident angle, a scanning angle, and a distance between the first equipment and the RF transmitter device.

10. The system according to claim 7, wherein the first equipment and the second equipment are in a vicinity of a first physical obstructing object and a second physical obstructing object, respectively, wherein the first physical obstructing object is a completely obstructing object and the second physical obstructing object is a partially obstructing object.

11. The system according to claim 10, wherein the first set of criteria corresponds to a location of the first equipment, a relative distance of the first equipment with respect to the RF transmitter device, a type of the first physical obstructing object, and a passive reflection of the received plurality of RF signals.

12. The system according to claim 10, wherein the second set of criteria corresponds to a location of the second equipment, a relative distance of the second equipment with respect to the RF transmitter device, the RF receiver device and the first equipment, a type of the second physical obstructing object, and an active reflection of the received plurality of RF signals.

13. The system according to claim 7, wherein the second equipment is further configured to adjust an amplitude gain, adjust a phase shift, perform beam forming to generate the directed beam, and perform beam steering of the received plurality of RF signals based on a first and a second phase shifting.

14. The system according to claim 7, wherein the RF transmitter device is further configured to coordinate communication of configuration information to configure or reconfigure the second equipment.

15. A method, comprising:
  in a reflector device:
    adjusting a first amplification gain of each of a plurality of radio frequency (RF) signals received from a first equipment via a first radio path of a non-line-of-sight (NLOS) radio path;
    performing a first phase shift on each of the plurality of RF signals with the adjusted first amplification gain to generate a plurality of first phase-shifted RF signals;
    communicating a combination of the plurality of first phase-shifted RF signals;
    performing a second phase shift on each of the plurality of first phase-shifted RF signals to generate a plurality of second phase-shifted RF signals; and
    transmitting the plurality of RF signals as a directed beam to a second equipment via a second radio path of the NLOS radio path,
    wherein the directed beam is transmitted to the second equipment based on the plurality of second phase-shifted RF signals.

16. The method according to claim 15, further comprising adjusting a second amplification gain of each of the plurality of second phase-shifted RF signals.

17. The method according to claim 15, further comprising creating a baseband signal based on demodulation of the combination of the plurality of first phase-shifted RF signals.

18. The method according to claim 17, further comprising decomposing variable amplitude of the baseband signal into constant amplitude decomposed analog signals.

19. The method according to claim 18, further comprising creating a constant amplitude decomposed RF signals based on modulation and mixing of the constant amplitude decomposed analog signals.

20. A non-transitory computer-readable medium having stored thereon, computer-executable instruction, which when executed by a computer, cause the computer to execute operations, the operations comprising:
  in a reflector device:
    adjusting a first amplification gain of each of a plurality of radio frequency (RF) signals received from a first equipment via a first radio path of a non-line-of-sight (NLOS) radio path;
    performing a first phase shift on each of the plurality of RF signals with the adjusted first amplification gain to generate a plurality of first phase-shifted RF signals;
    communicating a combination of the plurality of first phase-shifted RF signals;
    performing a second phase shift on each of the plurality of first phase-shifted RF signals to generate a plurality of second phase-shifted RF signals; and
    transmitting the plurality of RF signals as a directed beam to a second equipment via a second radio path of the NLOS radio path,
    wherein the directed beam is transmitted to the second equipment based on the plurality of second phase-shifted RF signals.

* * * * *